United States Patent
Pepper

(10) Patent No.: US 6,661,297 B2
(45) Date of Patent: Dec. 9, 2003

(54) MULTI-OCTAVE WIDEBAND VOLTAGE CONTROLLED OSCILLATOR

(75) Inventor: Steven H. Pepper, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/748,639

(22) Filed: Dec. 20, 2000

(65) Prior Publication Data

US 2002/0075086 A1 Jun. 20, 2002

(51) Int. Cl.[7] .............................................. H03B 27/00
(52) U.S. Cl. ........................... 331/49; 331/46; 331/48; 331/179; 331/117 R; 331/177 V; 331/107 SL
(58) Field of Search ...................... 331/49, 46, 117 R, 331/74, 177 V, 48, 179, 107 SL

(56) References Cited

U.S. PATENT DOCUMENTS

| | | | |
|---|---|---|---|
| 3,835,384 A | | 9/1974 | Liff |
| 3,921,085 A | | 11/1975 | Keane |
| 4,360,788 A | | 11/1982 | Erps et al. |
| 4,827,230 A | | 5/1989 | Harris |
| 5,200,713 A | * | 4/1993 | Grace et al. .................. 331/49 |
| 5,418,500 A | | 5/1995 | Igarashi |
| 5,434,544 A | * | 7/1995 | Van Veenendaal ...... 331/117 R |
| 5,714,914 A | * | 2/1998 | Zhou ...................... 331/117 R |
| 5,748,047 A | | 5/1998 | Guthrie et al. |
| 5,826,180 A | | 10/1998 | Golan |
| 5,838,749 A | | 11/1998 | Casper et al. |
| 5,841,326 A | * | 11/1998 | Kitazono et al. ....... 331/117 R |
| 5,945,881 A | | 8/1999 | Lakshmikumar |
| 5,982,240 A | * | 11/1999 | Hayashi ...................... 331/40 |

* cited by examiner

*Primary Examiner*—Arnold Kinkead
(74) *Attorney, Agent, or Firm*—Francis I. Gray

(57) ABSTRACT

A multi-octave, wideband voltage controlled oscillator has a plurality of high impedance current output individual voltage controlled oscillators coupled in parallel to form a bank of voltage controlled oscillators covering at least one high frequency octave. The outputs of the VCOs are wire-OR'd together and the VCOs are selected by a select signal that turns on the desired oscillator(s). A main limiter/divider selects a frequency octave at either the fundamental frequency of the selected VCO or a sub-harmonic thereof as the multi-octave, wideband voltage controlled oscillator output. A reference limiter/divider selects a reference frequency from the selected VCO for use in a phase locked loop. Each VCO has a tank circuit coupled across the bases of a pair of transistors, the emitters of which are coupled through respective current sources to ground. The collectors of the transistors are coupled to the wire-OR'd network. A summer/subtracting circuit may be added at the output of the VCOs or at the inputs of the limiter/dividers so that either the fundamental or second harmonic frequency of the selected VCO is selected.

12 Claims, 2 Drawing Sheets

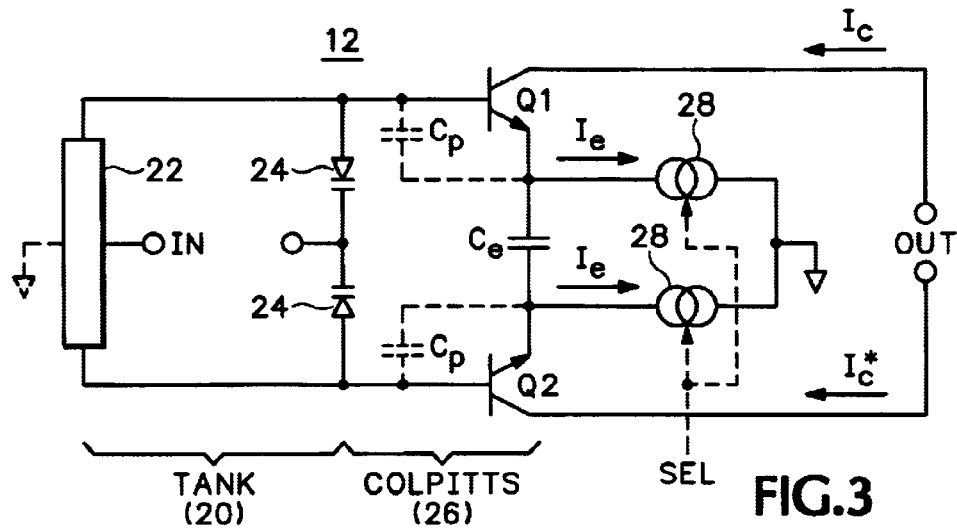
FIG. 3
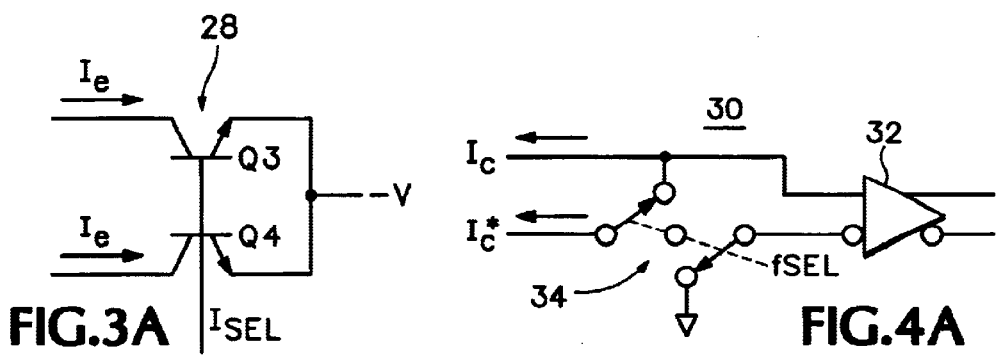
FIG. 3A
FIG. 4A
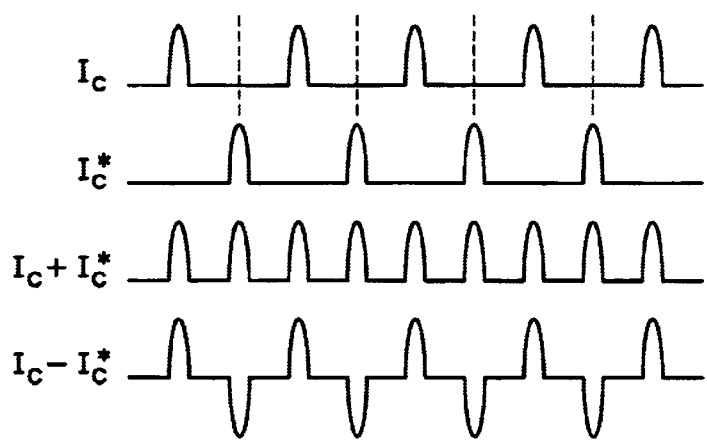
FIG. 4

MULTI-OCTAVE WIDEBAND VOLTAGE CONTROLLED OSCILLATOR

BACKGROUND OF THE INVENTION

The present invention relates to voltage controlled oscillators, and more particularly to a multi-octave, wideband voltage controlled oscillator suitable for use in instruments that require a broad range of frequencies, such as spectrum analyzers, frequency synthesizers, sweepers or the like.

For many uses a broadband range of frequencies is desirable. Conventionally spectrum analyzers, as one of the uses, have used magnetically tunable filters and oscillators that use ferrite resonators, such as Yttrium-Iron-Garnet or other materials. One such YIG oscillator is shown in U.S. Pat. No. 4,827,230. This is a rather large, heavy and power hungry oscillator. A bank of voltage controlled oscillators has been used to provide a broadband range, each oscillator having a voltage signal output with the outputs being switched to a load using radio frequency (RF) switches to select the desired frequency range from the bank, as shown in U.S. Pat. No. 3,921,085. At least one octave of frequency is desired, and continuous coverage over multiple frequency octaves is preferred. However switching the outputs of the oscillators in the bank does not necessarily mean turning off the oscillator itself. Therefore additional circuitry is needed to also turn off the oscillators that are not selected in order to save power. Also when providing two frequency outputs—one for a main output and another for a phase locked loop (PLL) reference frequency output—the power output is split between the two outputs through the use of a power divider network.

Also very high frequency oscillators are desired to be used, especially as the communications frequencies increase to 10 GHz and above. One such high frequency voltage controlled oscillator is shown in U.S. Pat. No. 5,418,500. However the output, which is at the second harmonic frequency of the oscillator fundamental frequency, is a low power output referenced to a "balanced neutral point." Also since the fundamental frequency is taken directly from the tank circuit, the tank circuit is loaded down by the load which reduces the Q of the circuit, increasing the phase noise. Small changes, such as noise, on the control or tuning signal may result in large phase noise due to crosstalk. Also the coupling capacitors are part of the tank circuit which reduces the effect of the varactor since it is desired that the variable capacitance be the largest part of the tank circuit.

Another proposed high frequency voltage controlled oscillator that provides a low power output has a pair of inductors coupled to ground with the opposing ends being coupled to respective bases of a pair of transistors. A pair of opposing varactors are coupled in series across the emitters, forming with the base-emitter and emitter—emitter capacitances a Colpitts oscillator. A tuning control signal is applied at the junction of the varactors. However having the varactors at the emitters of the transistors changes the loop gain, which is undesirable.

What is desired is a multi-octave, wideband voltage controlled oscillator suitable for various broad range frequency applications that uses minimal power, i.e., is suitable for battery operation, while maintaining low phase noise.

BRIEF SUMMARY OF THE INVENTION

Accordingly the present invention provides a multi-octave, wideband voltage controlled oscillator in the form of a bank of high frequency voltage controlled oscillators that provide a current output. The individual oscillators are selectable on command by turning on the desired oscillator (s), the others remaining off. The outputs are wire-OR'd together so that the selected output is available to respective limiter/divider circuits without loss of power. A main output from the main limiter/divider provides the desired frequency octave, and a phase locked loop (PLL) output from the reference limiter/divider provides a PLL reference frequency. Each individual oscillator has a tank circuit consisting of a lumped inductance, or a length of transmission line, in parallel with a pair of opposed varactors coupled in series with a voltage control signal being applied between virtual ground at the lumped inductance and the junction of the varactors. The tank circuit is coupled across the bases of a pair of emitter-coupled transistors in a balanced common collector Colpitts oscillator configuration, with the current output being taken from the collectors. A summer/subtractor circuit may be added at the output of each VCO or at the input of the limiter/dividers to select either a fundamental or a second harmonic frequency from the selected VCO.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 3 is a partial schematic view of an individual voltage controlled oscillator for use in the multi-octave, wideband voltage controlled oscillator according to the present invention.

FIG. 3A is a schematic view of a switchable current source for use in the individual voltage controlled oscillator of FIG. 3 according to the present invention.

FIG. 4 is a waveform view of the current pulse output of the individual voltage controlled oscillator for the multi-octave, wideband voltage controlled oscillator according to the present invention.

FIG. 4A is a schematic view of a summing/differencing circuit for selecting one of two harmonic frequencies for the multi-octave, wideband voltage controlled oscillator according to the present invention.

DETAILED DESCRIPTION OF THE INVENTION

Figure 1:
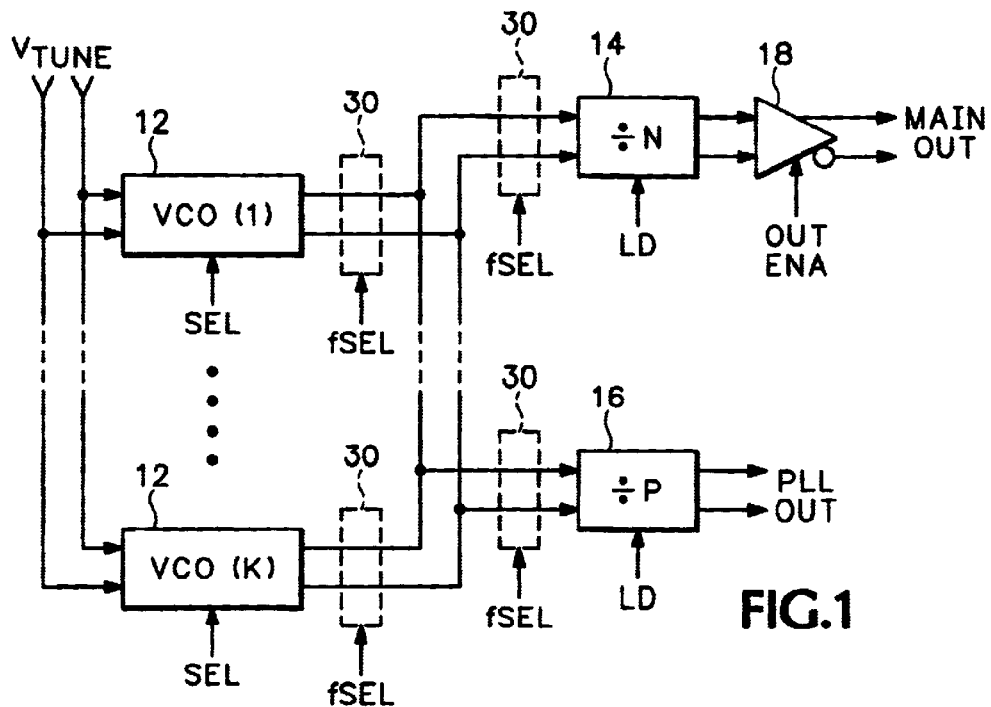
FIG. 1 is a block diagram view of a multi-octave, wideband voltage controlled oscillator according to the present invention.

Referring now to FIG. 1 a plurality of individual voltage controlled oscillators (VCOs) 12 are coupled in parallel. A tuning signal, $V_{tune}$, is applied to a balanced control input of each of the VCOs 12 either in parallel as shown or individually, and balanced outputs from the VCOs are wire-OR'd together. Each VCO 12 provides a high impedance current output. A select signal also is applied to each VCO 12 to turn on the desired one or more VCOs, depending upon whether a single (normally) or multiple frequency output is desired. The wire-OR'd output may be coupled to a main limiter/divider 14 that has a programmable divisor, N, and to a reference limiter/divider 16 that has a programmable divisor, P. The output of the main limiter/divider 14 is input to a buffer amplifier 18 to provide a balanced main VCO output. The output of the reference limiter/divider 16 provides a balanced frequency output for use in a phase locked loop (PLL). The buffer amplifier 18 is controlled by an output enable signal to turn on/off the balanced main VCO output. Implemented as an integrated circuit (IC) the wire-OR'd bus has very short leads so the output impedance is essentially constant for the VCOs 12.

Figure 2:
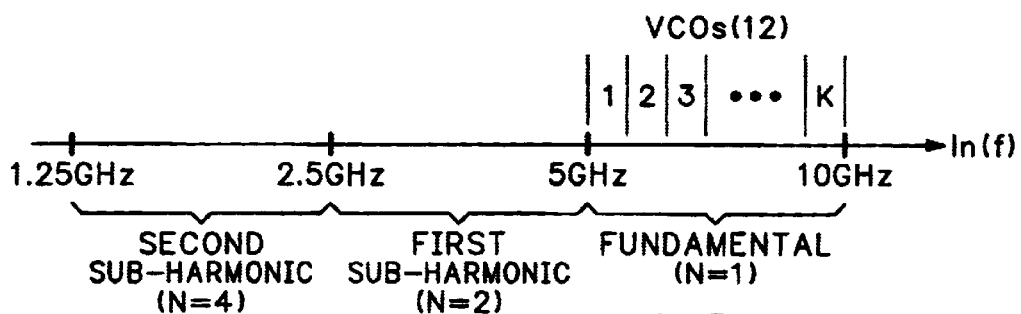
FIG. 2 is a frequency spectrum view for the multi-octave, wideband voltage controlled oscillator according to the present invention.

In operation generally one of the VCOs 12 is selected by the select signal while leaving the other VCOs turned off. The selected VCO 12 provides a frequency range output determined by $V_{tune}$ over the wire-OR'd output to the respective limiter/dividers 14/16. The main limiter/divider 14 controls the octave for the main output frequency, i.e., selects the VCO output frequency or a sub-harmonic as shown in FIG. 2. For example, if N=2, then the second sub-harmonic is selected. The frequency range of the bank of VCOs 12 is at a high frequency and covers at least one octave to provide a continuous scanning range over the full range of the multi-octave, wideband voltage controlled oscillator, i.e., a frequency octave from 5–10 GHz, 10–20 GHz, etc. The first sub-harmonic then covers a frequency octave from 2.5–5 GHz or 5–10 GHz, etc., the second sub-harmonic (N=4) covers the frequency octave from 1.25–2.5 or 2.5–5 GHz, etc.

The wire-OR'd output also is input directly to the reference limiter/divider 16 to provide the PLL reference frequency. Although P may be programmable, it also may be fixed. Since the outputs of the VCOs 12 are wire-OR'd together, there is no power reduction to the main output by also having the PLL output.

A VCO 12 suitable for use in the multi-octave, wideband voltage controlled oscillator is shown in FIG. 3. A tank circuit 20 has a distributed transmission line 22 as a lumped inductor and in parallel a pair of opposing varactors 24 connected serially. A frequency tuning input signal is applied between the junction of the varactors 24 and a virtual ground for the transmission line 22, i.e., the midpoint of the transmission line. The tank circuit is coupled across the bases of a pair of transistors Q1, Q2 such that the varactor/transmission line junctions are coupled respectively to the transistor bases to form a balanced Colpitts oscillator 26. The remaining capacitance is made up of the parasitic capacitances, $C_p$, between the base and emitter of each transistor Q1, Q2 and a capacitance, $C_e$, coupled between the respective emitters. The transistors Q1, Q2 are biased by respective current sources 28 coupled between the emitters and ground. The select signal controls whether the current sources are on or off and, thus, whether the VCO 12 is selected or not. The frequency tuning input signal varies the capacitance of the varactors 24, which is the largest source of capacitance in the tank circuit 20, without varying the loop gain. The output is a series of current pulses, as shown in FIG. 4, with the pulsed current, $I_C$, at the collector of one transistor Q1 being out-of-phase with the pulses, $I_c^*$, from the collector of the other transistor Q2.

As shown in FIG. 3A the current sources 28 may be in the form of a pair of transistors Q3, Q4 coupled in series between the respective emitters of the oscillator transistors Q1, Q2 and a relatively negative potential. The collectors of the current source transistors Q3, Q4 are coupled to the respective emitters of the oscillator transistors Q1, Q2 and the emitters are coupled to the relative negative potential. The select signal SEL in the form of a current signal $I_{SEL}$ is applied to the respective bases of the current source transistors Q3, Q4 to turn them on/off and, thus, turn on/off the associated VCO 12.

As also shown in FIG. 4 the current outputs from the VCO 12 may be either summed or subtracted to obtain either a fundamental frequency current output or a second harmonic frequency current output. A circuit 30 for performing this is shown in FIG. 4A. A buffer amplifier 32 has one non-inverted input and one inverted input coupled to respective collector outputs from the VCO 12 with a balanced output. The inverted input is coupled to the collector of one of the oscillator transistors Q3, Q4 via a switch 34. In a first position of the switch 34 the current output $I_c^*$ is coupled to the inverting input of the buffer amplifier 32 so that the output from the buffer amplifier is $I_c-I_c^*$, the fundamental frequency. In a second position of the switch 34, as shown in FIG. 4A, the inverting input of the buffer amplifier 34 is coupled to ground and the two current outputs are wire-OR'd together to produce $I_c+I_c^*$, the second harmonic frequency. A frequency select signal fSEL determines the position of the switch 34. As shown by dotted boxes in FIG. 1, this circuit 30 may be placed at the output from each of the VCOs 12 or at the input to the limiter/dividers 14, 16. Therefore one octave may be controlled by fSEL so that the bank of VCOs 12 that cover the frequency octave of 10–20 GHz over the respective fundamental frequencies may be selected to cover the frequency octave of 20–40 GHz.

Thus the present invention provides a multi-octave, wideband voltage controlled oscillator by using a plurality of current output individual VCOs coupled in parallel covering at least one octave at a high frequency, the outputs of the VCOs having their outputs wire-OR'd together, the individual VCOs being selected by turning on the selected current sources and the tank circuit for each VCO being coupled to the bases (balanced input) with the current outputs being taken from the collectors (balanced output).

What is claimed is:

1. A multi-octave, wideband voltage controlled oscillator comprising:

a plurality of high frequency, wideband individual voltage controlled oscillators coupled in parallel to form a bank of voltage controlled oscillators, each individual voltage controlled oscillator having a tuning input, a select input, and a balanced high impedance current output;

means for ORing the balanced high impedance current outputs of the bank of voltage controlled oscillators together to provide a single balanced current output for the multi-octave, wideband voltage controlled oscillator.

2. A multi-octave, wideband voltage controlled oscillator comprising:

a plurality of high frequency, wideband individual voltage controlled oscillators coupled in parallel to form a bank of voltage controlled oscillators, each individual voltage controlled oscillator having a tuning input, a select input, and a high impedance current output where each individual voltage controlled oscillator has a pair of oscillator transistors, each having a base, emitter and collector, the collectors being coupled to the high impedance current output, a tank circuit coupled across the bases of the pair of oscillator transistors, the tank circuit being coupled to the tuning input in order to tune a frequency of the high impedance current output for the voltage controlled oscillator, and a current source coupled to each of the emitters of the pair of oscillator transistors, the current source being coupled to the select input; and means for ORing the high impedance current outputs of the bank of voltage controlled oscillators together to provide a single current output for the multi-octave, wideband voltage controlled oscillator.

3. The multi-octave, wideband voltage controlled oscillator as recited in claim 2 further comprising main means coupled to the ORing means for selecting a harmonic frequency related to a frequency of the single current output.

4. The multi-octave, wideband voltage controlled oscillator as recited in claim 3 further comprising reference means coupled to the ORing means for selecting a reference frequency for a phase locked loop from the frequency of the single current output.

5. A multi-octave, wideband voltage controlled oscillator comprising:
- a plurality of high frequency, wideband individual voltage controlled oscillators coupled in parallel to form a bank of voltage controlled oscillators, each individual voltage controlled oscillator having a tuning input, a select input, and a high impedance current output;
- means for ORing the high impedance current outputs of the bank of voltage controlled oscillators together to provide a single current output for the multi-octave, wideband voltage controlled oscillator; and
- a frequency output select circuit coupled to the high impedance current output of each individual voltage controlled oscillator for selecting between a first and second harmonic of a frequency for the single current output.

6. The multi-octave, wideband voltage controlled oscillator as recited in claim 2 wherein the tank circuit comprises:
- a lumped inductance; and
- a pair of opposing, serially connected varactors in parallel with the lumped inductance, the tuning input being between the junction between the varactors and a virtual ground of the lumped inductance and the respective junctions between the lumped inductance and the serially connected varactors being coupled to the respective bases of the pair of oscillator transistors.

7. The multi-octave, wideband voltage controlled oscillator as recited in claim 6 wherein the lumped inductance comprises a transmission line.

8. The wideband voltage controlled oscillator as recited in claim 5 wherein the frequency output select circuit comprises:
- a buffer amplifier having an inverted and non-inverted input and having an output, the output being coupled to a main and reference means and collector of one of a pair of oscillator transistors being coupled to the non-inverted input;
- a switch having an input coupled to a collector of the other one of the pair of oscillator transistors, the switch in a first position coupling the collector of the other one of the pair of oscillator transistors to the non-inverted input of the buffer amplifier for wire Oring with the collector of the one of the pair of oscillator transistors and coupling the inverted input of the buffer amplifier to a reference potential and in a second position coupling the collector of the other one of the pair of oscillator transistors to the inverted input of the buffer amplifier such that the output of the buffer amplifier is the sum of currents from the collectors when the switch is in the first position and is the difference when the switch is in the second position.

9. The multi-octave, wideband high frequency voltage controlled oscillator as recited in claim 8 wherein a current source comprises a pair of source transistors each having a base, collector and emitter and each being coupled in series between the respective collectors of the pair of oscillator transistors and a source reference potential with the bases forming the select input such that a signal applied to the bases turns on the individual voltage controlled oscillator.

10. A wideband voltage controlled oscillator comprising:
- a pair of transistors, each having a base, emitter and collector with the collectors providing a balanced high impedance current output;
- a capacitance coupled between the emitters of the pair of transistors;
- a tank circuit coupled across the bases of the pair of transistors having a frequency determined by a frequency tuning input signal without varying a loop gain; and
- a separate current source coupled to each emitter.

11. A wideband voltage controlled oscillator comprising:
- a pair of transistors, each having a base, emitter and collector with the collectors providing a balanced high impedance current output;
- a tank circuit coupled across the bases of the pair of transistors having a frequency determined by a frequency tuning input signal, the tank circuit having a lumped inductance and a pair of varactors coupled in series opposition, the pair of varactors being coupled in parallel with the lumped inductance such that each varactor/lumped inductance junction is coupled to a respective one of the bases of the pair of transistors and the frequency tuning input signal is applied between the junction between the pair of varactors and a virtual ground for the lumped inductance; and
- a current source coupled to each emitter.

12. The wideband voltage controlled oscillator as recited in claim 11 wherein the lumped inductance comprises a transmission line.

* * * * *